United States Patent
Gauthier et al.

(10) Patent No.: US 11,038,017 B2
(45) Date of Patent: Jun. 15, 2021

(54) BIPOLAR-TRANSISTOR DEVICE AND CORRESPONDING FABRICATION PROCESS

(71) Applicant: STMicroelectronics (Crolles 2) SAS, Crolles (FR)

(72) Inventors: Alexis Gauthier, Meylan (FR); Julien Borrel, Claix (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 66 days.

(21) Appl. No.: 16/279,361

(22) Filed: Feb. 19, 2019

(65) Prior Publication Data

US 2019/0259838 A1 Aug. 22, 2019

(30) Foreign Application Priority Data

Feb. 21, 2018 (FR) ...................................... 1851485

(51) Int. Cl.
*H01L 29/08* (2006.01)
*H01L 29/06* (2006.01)
*H01L 29/167* (2006.01)
*H01L 29/66* (2006.01)
*H01L 29/737* (2006.01)
(Continued)

(52) U.S. Cl.
CPC ...... *H01L 29/0821* (2013.01); *H01L 29/0649* (2013.01); *H01L 29/167* (2013.01); *H01L 29/66242* (2013.01); *H01L 29/66287* (2013.01); *H01L 29/732* (2013.01); *H01L 29/7371* (2013.01); *H01L 29/7378* (2013.01); *H01L 21/26586* (2013.01)

(58) Field of Classification Search
CPC ............... H01L 29/0821; H01L 29/732; H01L 29/0649; H01L 29/167; H01L 29/66242; H01L 29/7371
See application file for complete search history.

(56) References Cited

U.S. PATENT DOCUMENTS 6,455,919 B1 9/2002 Brennan et al.
2002/0185708 A1 12/2002 Coolbaugh et al.
(Continued)

FOREIGN PATENT DOCUMENTS

WO 03046948 A2 6/2003
WO 2004090968 A1 10/2004

OTHER PUBLICATIONS

Frédéric Boucard, "Modélisation de la diffusion des dopants dans le silicium pour la réalisation de jonctions fines," Micro et nanotechnologies/Microélectronique; Université Louis Pasteur—Strasbourg I, 2003 (206 pages).
(Continued)

*Primary Examiner* — Quoc D Hoang
(74) *Attorney, Agent, or Firm* — Crowe & Dunlevy

(57) ABSTRACT

A bipolar junction transistor includes an extrinsic collector region buried in a semiconductor substrate under an intrinsic collector region. Carbon-containing passivating regions are provided to delimit the intrinsic collector region. An insulating layer on the intrinsic collector region includes an opening within which an extrinsic base region is provided. A semiconductor layer overlies the insulating layer, is in contact with the extrinsic base region, and includes an opening with insulated sidewalls. The collector region of the transistor is provided between the insulated sidewalls.

23 Claims, 7 Drawing Sheets

(51) Int. Cl.
*H01L 29/732* (2006.01)
*H01L 21/265* (2006.01)

(56) References Cited

U.S. PATENT DOCUMENTS

| | | | |
|---|---|---|---|
| 2005/0184359 A1 | 8/2005 | Akatsu et al. | |
| 2006/0154476 A1 | 7/2006 | Freeman et al. | |
| 2006/0252216 A1* | 11/2006 | Dokumaci | H01L 29/0821 438/312 |
| 2013/0277804 A1* | 10/2013 | Cheng | H01L 29/66287 257/586 |

OTHER PUBLICATIONS

NPI Search Report and Written Opinion for FR 1851485 dated Oct. 29, 2018 (7 pages).

* cited by examiner

BIPOLAR-TRANSISTOR DEVICE AND CORRESPONDING FABRICATION PROCESS

PRIORITY CLAIM

This application claims the priority benefit of French Application for Patent No. 1851485, filed on Feb. 21, 2018, the content of which is hereby incorporated by reference in its entirety to the maximum extent allowable by law.

TECHNICAL FIELD

Embodiments and methods of implementation relate to integrated circuits and especially to bipolar junction transistors, in particular bipolar junction transistors intended to be integrated into high-frequency technologies.

BACKGROUND

Base-collector capacitance is a characteristic feature of bipolar transistors. Typically, the base-collector capacitance is formed by a parasitic capacitor between an extrinsic base region and an intrinsic collector region that are separated by an insulator, this capacitor also being referred to as an extrinsic capacitor.

The maximum operating frequency of a bipolar transistor is very sensitive to the capacitance of this extrinsic capacitor.

Variation in the extrinsic capacitance may severely degrade the maximum operating frequency of the transistor, it is therefore desirable to restrict this extrinsic capacitance as much as is possible.

SUMMARY

In accordance with one aspect, a process for fabricating at least one bipolar junction transistor, in particular a heterojunction bipolar transistor, comprises: a step of forming a buried extrinsic collector region in a semiconductor substrate, under an intrinsic collector region; a step of forming an insulating region on the intrinsic collector region; and a step of forming an extrinsic base region on the insulating region. The process further comprises, between the formation of the extrinsic collector region and the formation of the insulating region, a step of forming carbon-containing passivating regions in the intrinsic collector region and facing the extrinsic base region.

Thus, certain dopants, for example originating from the collector region, cannot migrate through the intrinsic collector to the extrinsic base, for example during typical annealing phases, because of the presence of carbon-containing passivating regions in the intrinsic collector region and facing the extrinsic base region.

This in particular allows the extrinsic base-collector capacitance to be restricted.

Furthermore, it is inexpensive and simple to form carbon-containing passivating regions in the intrinsic collector region and facing the extrinsic base region.

Moreover, in bipolar transistors and in particular in high-frequency technologies, the hole current flowing from the base to the emitter must generally be negligible with respect to the electron current originating from the emitter. A heterojunction (i.e., a junction between two semiconductors the bandgaps of which are different) at the base-emitter interface allows the hole current to be blocked, this being advantageous, in particular for high-frequency technologies.

According to one method of implementation, said step of forming passivating regions comprises forming a carbon implant that is configured to form agglomerates with auto-interstitial crystal defects in the intrinsic collector layer.

Specifically, implanting carbon is a particularly effective way of blocking the diffusion of dopants such as phosphorus ions that use auto-interstitial defects to diffuse, generally during the application of heat.

Specifically, during an implantation, the bombarded ions knock out atoms, typically silicon atoms, belonging to the crystal lattice of the substrate. These silicon atoms then occupy interstitial sites and form what are called auto-interstitial crystal defects.

The carbon thus implanted reacts with the auto-interstitial defects and forms agglomerates. Thus, there are fewer auto-interstitial defects and the dopants diffuse less.

Nevertheless, the advantages that implanting carbon procures are applicable to other types of dopants, boron for example.

According to one method of implementation, the step of forming a buried extrinsic collector region in the semiconductor substrate comprises implanting dopants including phosphorous ions in a region that is localized depthwise in the substrate, the intrinsic collector layer comprising a portion of the substrate, which portion is located above said region that is localized depthwise in the substrate.

The step of forming the extrinsic collector layer according to this method of implementation is especially inexpensive and creates no topological defects.

According to one method of implementation, the method comprises, a step of forming, in the intrinsic collector region, a selectively overdoped collector region, this step comprising implanting dopants through an aperture in a mask formed on the intrinsic collector region, wherein said step of forming passivating regions in the intrinsic collector region furthermore comprises implanting carbon through said aperture in said mask at an oblique angle, so that said passivating regions include pockets of carbon that are positioned locally on either side of the selectively overdoped collector region.

Specifically, lateral diffusion of dopants of the selectively overdoped collector layer may occur in conventional structures, for example during typical annealing phases. This method of implementation advantageously allows the migration of dopants originating from the selectively overdoped collector layer to be neutralized, via the same effects of occupation of crystal defects of the interstitial-site type.

Moreover, this method of implementation may advantageously be adapted to conventional heterojunction-bipolar-transistor structures including a selectively overdoped collector region.

Thus, according to one method of implementation, said step of forming carbon-containing passivating regions in the intrinsic collector region is such that the regions formed face the extrinsic base region only in said pockets located on either side of said selectively overdoped collector region, the method comprising a step of forming lateral isolating regions in the rest of the intrinsic collector region facing the extrinsic base region.

According to another aspect, an integrated circuit comprises at least one bipolar junction transistor, in particular one heterojunction bipolar transistor, including an extrinsic collector region buried in a semiconductor substrate, under an intrinsic collector region, an insulating region on the intrinsic collector region and an extrinsic base region on the insulating region, the bipolar junction transistor comprising carbon-containing passivating regions in the intrinsic collector region and facing the extrinsic base region.

According to one embodiment, said passivating regions comprise implants of carbon atoms forming agglomerates with auto-interstitial crystal defects in the intrinsic collector layer.

According to one embodiment, said extrinsic collector region buried in the semiconductor substrate comprises dopants including phosphorous ions in a region that is localized depthwise in the substrate, the intrinsic collector layer comprising a portion of the substrate, which portion is located above said region that is localized depthwise in the substrate.

According to one embodiment, the integrated circuit comprises, in the intrinsic collector region, a selectively overdoped collector region, wherein said passivating regions in the intrinsic collector region comprise pockets of carbon that are positioned locally on either side of the selectively overdoped collector region.

According to one embodiment, said carbon-containing passivating regions in the intrinsic collector region are such that they face the extrinsic base region only in said pockets located on either side of said selectively overdoped collector region, the bipolar junction transistor comprising lateral isolating regions in the rest of the intrinsic collector region facing the extrinsic base region.

According to one embodiment, said at least one bipolar junction transistor is a heterojunction bipolar transistor.

BRIEF DESCRIPTION OF THE DRAWINGS

Other advantages and features of the invention will become apparent on examining the detailed description of methods of implementation and embodiments, which are completely non-limiting, and the appended drawings, in which.

DETAILED DESCRIPTION

FIGS. 1 to 7 show results of steps of a first method of implementation of a process for fabricating a heterojunction bipolar transistor.

Figure 1:
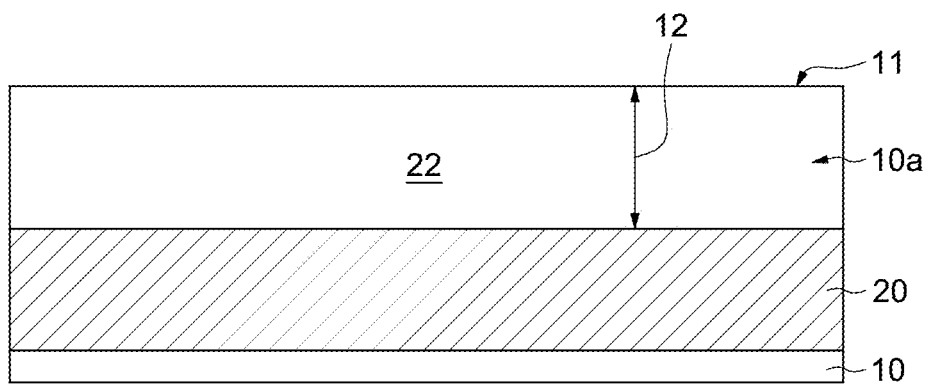
FIGS. 1 to 7 schematically illustrate one method of implementation of a process to form a transistor.

FIG. 1 shows the result of a step of forming a buried extrinsic collector region 20 in a semiconductor substrate 10, under a portion 10a of said substrate 10 forming an intrinsic collector region 22.

Conventionally, the semiconductor substrate is a p-doped single-crystal silicon substrate.

In this method of implementation, the step of forming the buried extrinsic collector region 20 in the semiconductor substrate 10 comprises implanting dopants in a region that is localized depthwise in the substrate 10, i.e. under the portion 10a of the substrate 10, at a distance 12 from the surface 11 of the substrate 10.

In this method of implementation, the future intrinsic collector region 22 thus comprises the portion 10a of the substrate 10, which portion is located above said depthwise-localized region 20.

The extrinsic collector region 20 is n$^+$-doped, advantageously by implantation of phosphorous ions, using a conventional process that is known per se and that allows such a depthwise-localized region configuration to be achieved.

For example, the extrinsic collector region 20 is n$^+$-doped with a dopant concentration comprised between 5×10$^{19}$ and 1×10$^{21}$ at/cm$^3$.

The implantation of the phosphorous ions generates defects, such as interstitial sites, in the crystal unit cells of the semiconductor substrate 10. In order to regain a regular crystal structure, in particular in the portion 10a that was passed through by the ions at the surface 11 of the substrate 10, a phase of light annealing is typically implemented.

However, during anneals, even light anneals, for example at 750° C. for 1 hour, the phosphorous ions have a tendency to migrate toward the surface of the substrate 10, i.e. through the portion that forms the intrinsic collector region 22.

As will become apparent below, in particular with regard to FIGS. 3 to 7, such a migration directs the dopants towards an intrinsic collector 22/insulating-region (61)/extrinsic-base-region (70) interface, degrading the capacitance of the extrinsic base-collector capacitor.

Figure 2:
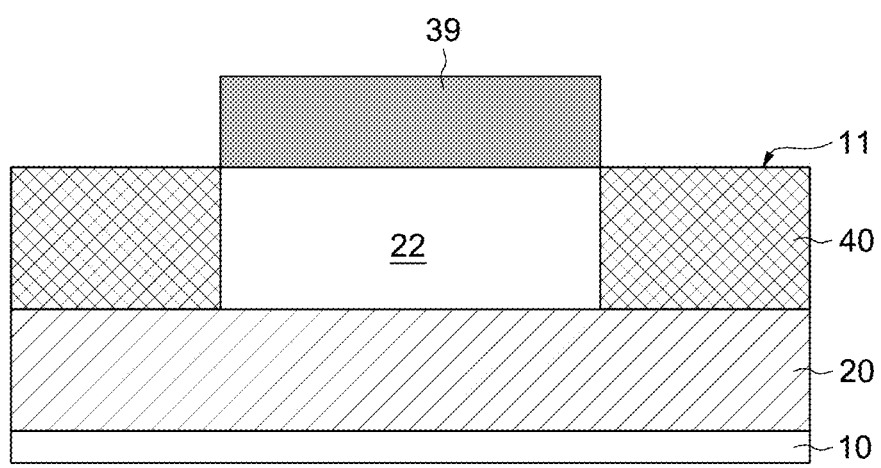

In this regard, FIG. 2 shows the result of a step of forming passivating regions 40 in the intrinsic collector region 22.

Specifically, in order to prevent the migration of dopants from the extrinsic collector region 20, the process for fabricating the heterojunction bipolar transistor advantageously includes, between the formation of the extrinsic collector region 20 and a step of forming an insulating region (61), a step of forming carbon-containing passivating regions 40 in the intrinsic collector region 22 and facing a future extrinsic base region (70).

The step of forming the future extrinsic base region (70) is described below with reference to FIGS. 3 to 7.

In this method of implementation, to form said passivating regions 40, a mask 39 was formed so as to substantially cover the position of the future intrinsic base region (72), and a blanket implantation of carbon was carried out so as to implant carbon into the portions 40 not covered by said mask 39.

As will become apparent below from the description given with reference to FIGS. 3 to 7, the portions that are not covered by the mask correspond to portions of the intrinsic collector region 22 that face the extrinsic base region (70).

The mask 39 is typically formed by photolithography of a photoresist, and may advantageously remain unchanged with respect to a conventional and already optimized technology comprising forming shallow trench isolations on either side of the mask 39, substantially in the same location as the passivating regions 40.

For example, the carbon implantation is carried out with a concentration per unit area comprised between 10$^{15}$ at/cm$^2$ and 10$^{16}$ at/cm$^2$ and with an energy comprised between 10 keV and 100 keV.

Such a step of forming passivating regions 40 allows the diffusion of dopants to be prevented by occupying crystal defects of the interstitial-site type that contribute to the diffusion of phosphorous ions, in particular during annealing phases.

As described in the document by Frédéric Boucard entitled "Modélisation de la diffusion des dopants dans le silicium pour la réalisation de jonctions fines," Micro et nanotechnologies/Microélectronique; Université Louis Pasteur—Strasbourg I, 2003 (incorporated by reference), crystal defects of the interstitial-site type may be created by an implantation of dopants, for example phosphorous ions, such as during the formation of the extrinsic collector region that is localized depthwise.

Said step of forming passivating regions 40 is thus advantageously configured so that the carbon atoms occupy interstitial sites in the intrinsic collector region 22.

Figure 3:
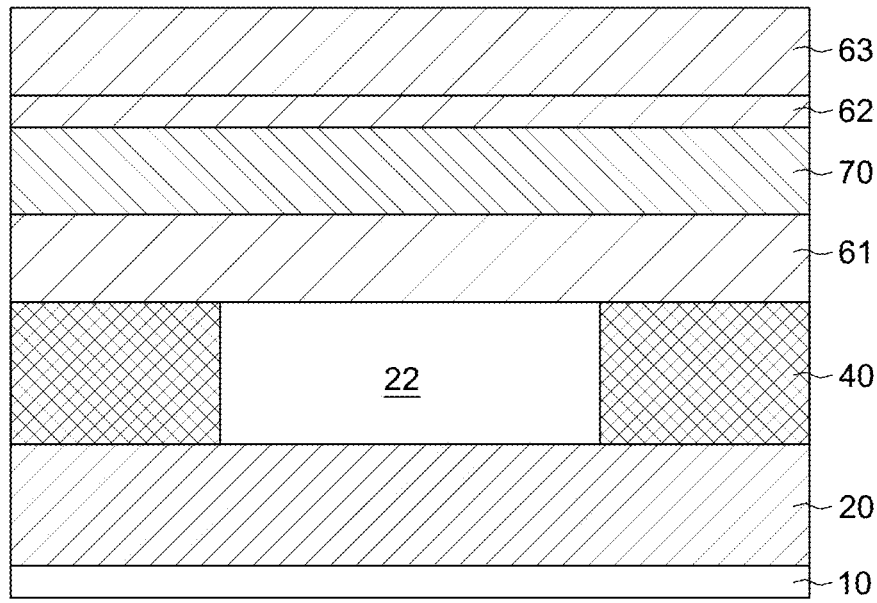

FIG. 3 shows the result of steps of forming, depositing and/or growing layers 61, 70, 62, 63 on the structure described above with reference to FIG. 2, after removal of the mask 39.

These layers 61, 70, 62, 63 are in particular intended to be designed to form a vertical-heterojunction-bipolar-transistor architecture.

Firstly, an insulating region 61, for example a silicon oxide, is formed above the intrinsic collector region 22 and the passivating regions 40 that it includes.

Next, a p$^+$-doped extrinsic base region 70 is formed above the insulating region 61. For example, the extrinsic base region 70 is obtained by epitaxial growth of p-doped and annealed polysilicon.

Moreover, a p-doped polycrystalline silicon-germanium alloy $Si_{1-x}Ge_x$, with x comprised between 0.1 and 0.5, may also be envisaged.

According to one variant of the process, to fabricate a bipolar junction transistor (i.e., a homojunction bipolar transistor), the extrinsic base region 70 is fabricated, in an analogous way, by depositing p-doped polysilicon above the insulating region 61.

The extrinsic base region 70 (and also the subjacent insulating region 61) extends substantially over the entire surface of a zone of the substrate, called the bipolar zone, in which at least one heterojunction bipolar transistor is formed according to methods of implementation of the process.

A second silicon-oxide layer 62 is formed above the extrinsic base region 70, and a silicon-nitride layer 63 is formed above the second oxide layer 62.

Figure 4:
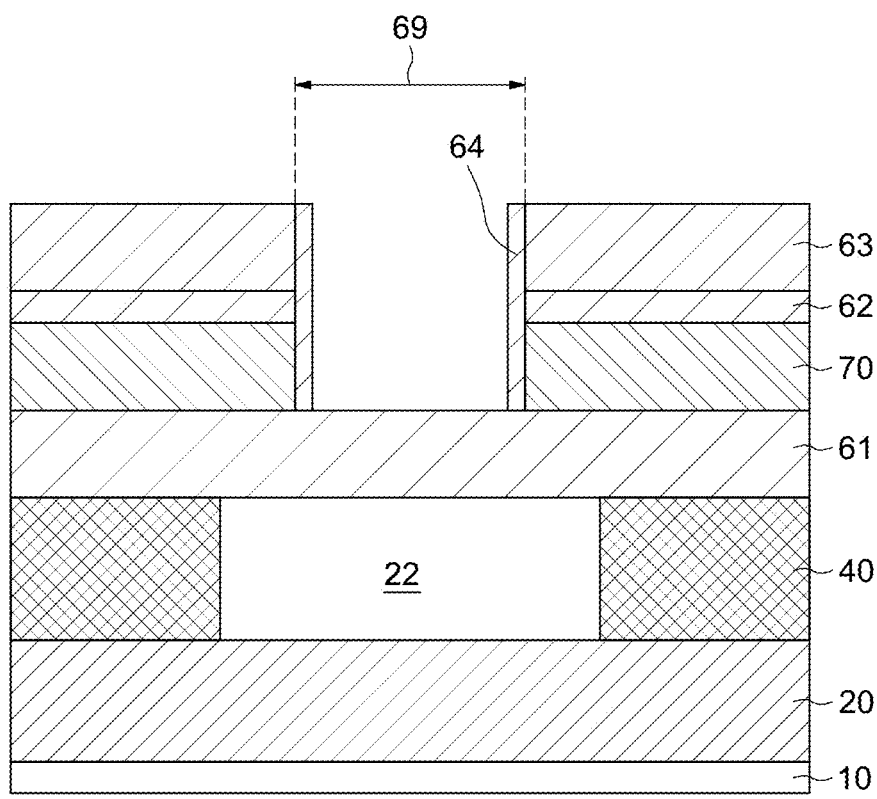

FIG. 4 shows the result of a step of etching an extrinsic-emitter aperture through the nitride and oxide layers 63 and 62 and through the extrinsic base region 70 of the structure described above with reference to FIG. 3.

The aperture 69 is formed in the interior and facing the portion previously covered by the mask (39) used to form carbon implants 40, as described above with reference to FIG. 2.

The sidewalls of the apertures 69 are covered with a vertical silicon-nitride layer 64.

Figure 5:
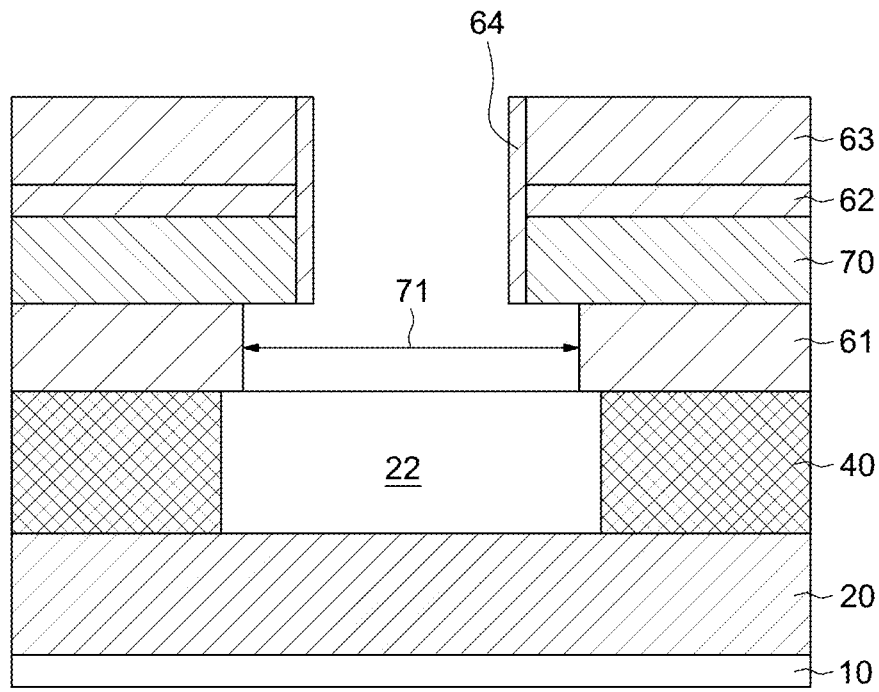

FIG. 5 shows the result of a step of etching an aperture 71 in the insulating region 61 of the structure described above with reference to FIG. 4.

For example, the aperture 71 in the insulating region 61 may be formed by selective wet chemical etching.

Figure 6:
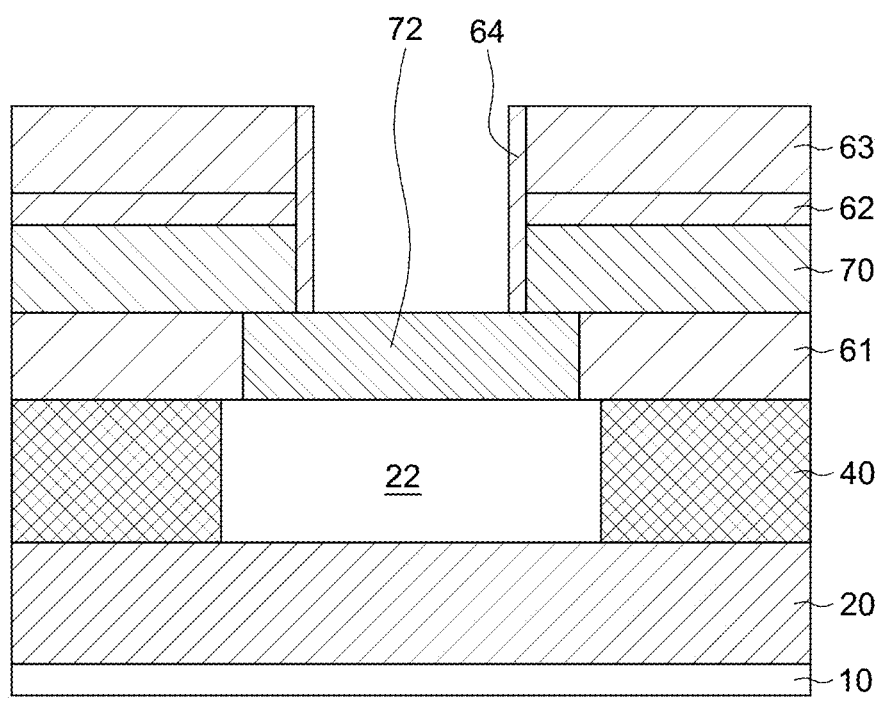

FIG. 6 shows the results of a step of forming an intrinsic base region 72 in the aperture (71) in the insulating region 61 of the structure described above with reference to FIG. 5.

The intrinsic base 72 may be formed by epitaxial growth of p-doped single-crystal silicon-germanium from the surface of the intrinsic collector region 22 uncovered by the aperture (71) in the insulating region 61.

According to one variant of the process introduced above with reference to FIG. 3, to fabricate a bipolar junction transistor (i.e., a homojunction bipolar transistor), the intrinsic base 72 may be formed, in an analogous way, by epitaxial growth of p-doped single-crystal silicon from the surface of the intrinsic collector region 22 uncovered by the aperture (71) in the insulating region 61.

With the exception of the step of forming the extrinsic base region 70 and of forming the intrinsic base region 72, the variant of the process for fabricating a bipolar junction transistor requires no other notable modification of the methods of implementation of the process that are described here and below.

Figure 7:
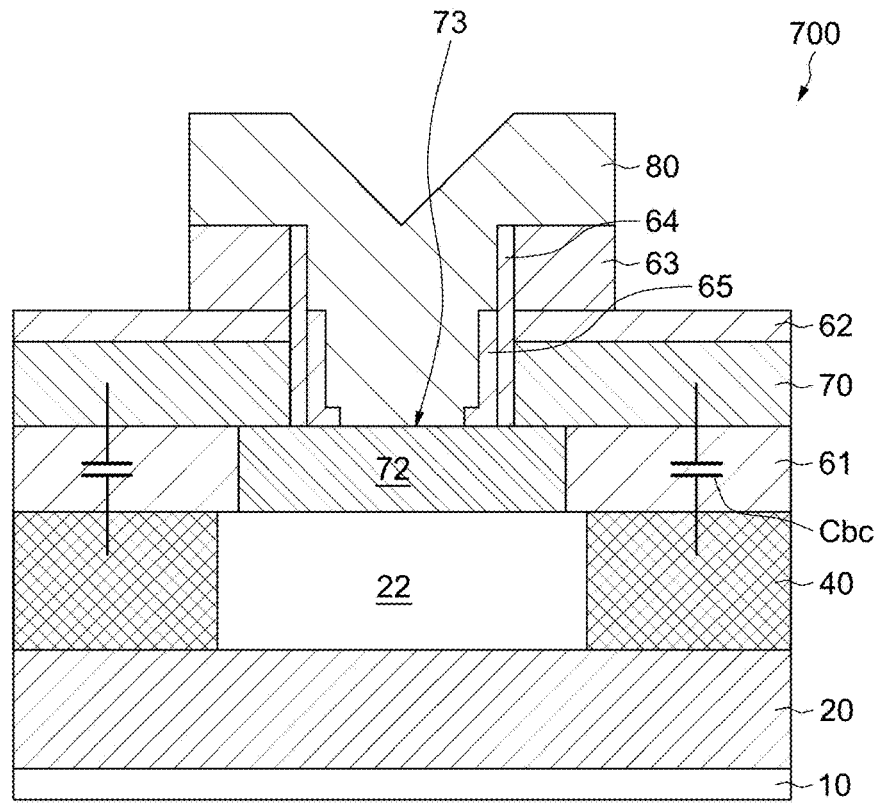

FIG. 7 shows the result of a step of forming an emitter 80 on the structure described above with reference to FIG. 6.

Conventionally, the emitter 80 is obtained by epitaxial growth from the uncovered portion 73 of the intrinsic base 72.

In this example, an insulating spacer region 65 made of silicon oxide and having an L-shape in its final position has been formed in the extrinsic emitter aperture (69) in order to space the emitter 80 from the extrinsic base region 70, on its sidewalls 64.

The extrinsic emitter 80 is then etched so as to include a lower portion, making contact with the intrinsic base 72, and a wider upper portion resting on the nitride layer 63.

The nitride layer 63 is also etched during the etch of the emitter 80, said etch being selectively stopped by the second silicon-oxide layer 62.

Thus, a heterojunction bipolar transistor 700 including an extrinsic collector region 20 buried in a semiconductor substrate 10, under an intrinsic collector region 22, an insulating region 61 on the intrinsic collector region 22 and an extrinsic base region 70 on the insulating region 61 is obtained, the heterojunction bipolar transistor 700 comprising carbon-containing passivating regions 40 in the intrinsic collector region 22 and facing the extrinsic base region 70.

The heterojunction bipolar transistor 700 thus produced in particular has a minimum extrinsic base-collector capacitance Cbc, and a regular well-controlled topology. In other words, the process for fabricating the heterojunction bipolar transistor 700 allows both the size of said heterojunction bipolar transistor to be minimized and its performance to be improved.

Furthermore, the process for fabricating this heterojunction bipolar transistor 700 is economical and compatible with processes that not only already exist but that also have already been optimized for this type of product.

FIGS. 8 to 11 show the results of steps of a second method of implementation of a process for fabricating a heterojunction bipolar transistor.

Figure 8:
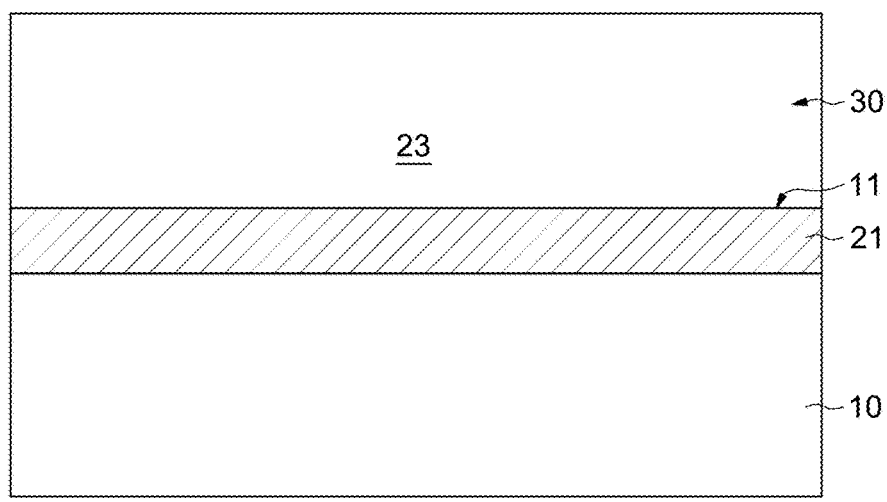
FIGS. 8 to 11 schematically illustrate another method of implementation of a process to form a transistor.

FIG. 8 shows the result of an alternative step of forming the extrinsic collector 21, with respect to the step described above with reference to FIG. 1. Elements that are common with the structure described above with reference to FIG. 1 have been given the same references and will not be detailed again here.

The step of forming the buried extrinsic collector region 21 in the semiconductor substrate 10 here comprises implanting dopants in a localized region 21 under the surface 11 of the substrate 10.

In this alternative, the extrinsic collector region 21 is also n$^+$-doped, for example by implantation of arsenic ions, using a conventional process that is known per se and that allows such a configuration to be achieved.

The step of implanting dopants into the region 21 typically comprises an annealing phase in order to rearrange the crystal structure of the region 21 that is located under the surface 11 of the substrate 10, and that was made amorphous by the implantation.

The extrinsic collector region 21 is said to be buried in the substrate 10 because it is covered by an intrinsic collector region 23, which is formed by epitaxial growth of a layer 30 of single-crystal silicon from the rearranged surface 11.

Figure 9:
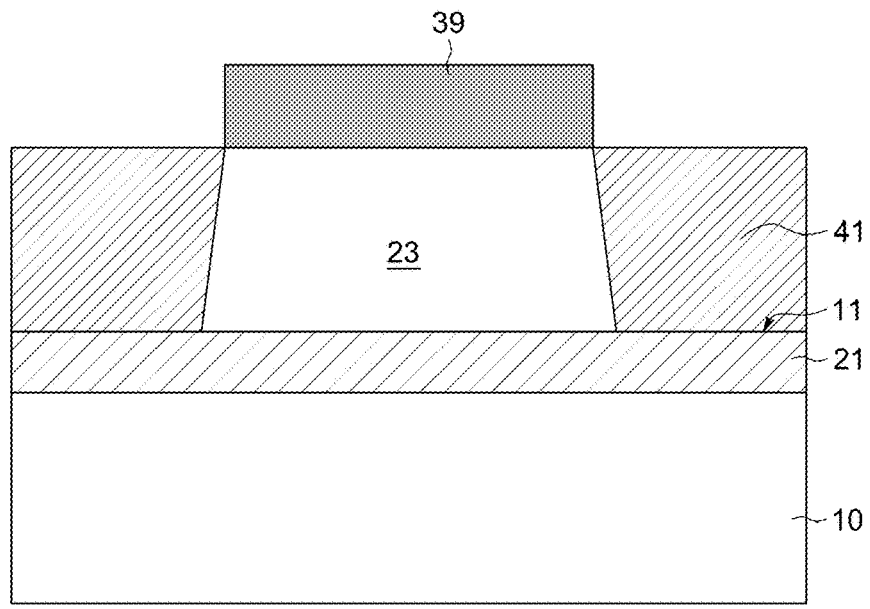

FIG. 9 shows the result of a step of forming a lateral isolating region 41 in the structure described above with reference to FIG. 8.

The step of forming the lateral isolating region 41 comprises forming a mask 39 covering the position of the future intrinsic base region (72), and a blanket step of forming lateral isolating regions 41 in those portions that are not covered by said mask 39.

For example, the lateral isolating regions 41 are shallow trench isolations (STIs).

Advantageously, the mask 39 of this alternative and the mask (39) used in the step of forming the passivating region (40) described above with reference to FIG. 2, although not used for the same purpose, are the same.

Thus, the mask 39 is formed so as to cover the position of the future intrinsic base region (72), and trenches are etched, and then filled with a dielectric, in those portions 41 of the epitaxial layer (30) which are not covered by said mask 39.

That portion of the epitaxial layer (30) which is flanked by the lateral isolating regions 41 thus forms the intrinsic collector region 23.

Figure 10:
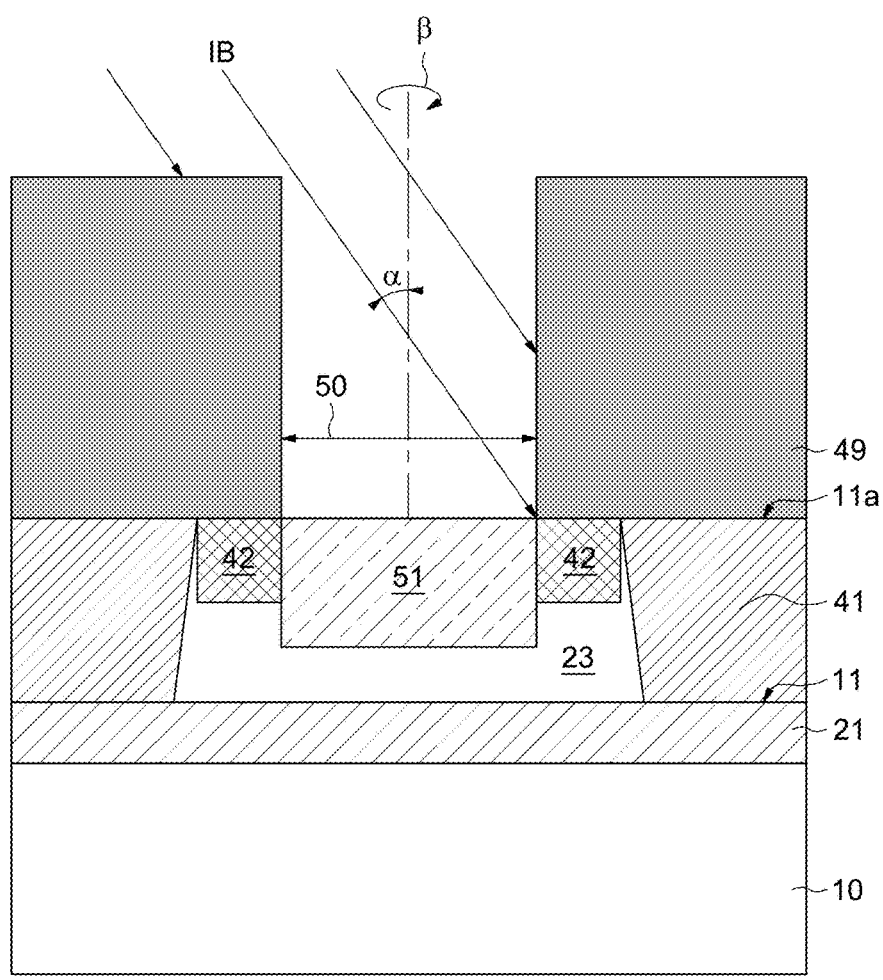

FIG. 10 shows the result of a step of forming a selectively overdoped collector region 51, and a step of forming pockets of carbon 42 in the intrinsic collector region 23 of the structure described above with reference to FIG. 9.

The step of forming passivating regions 42 in the intrinsic collector region 23 advantageously comprises forming pockets of carbon 42 that are positioned locally on either side of the future selectively overdoped collector region 51.

The step of forming a selectively overdoped collector region 51 comprises implanting dopants through an aperture in a mask 49 formed on the intrinsic collector region 22.

The step of forming passivating regions 42 in the intrinsic collector region 23 advantageously uses the mask 49 intended to produce the selectively implanted collector region 51.

Specifically, the implantation of carbon 42 into the intrinsic collector region 23 comprises irradiating the structure (such as shown in FIG. 10) with a beam of carbon ions IB that is inclined at a nonzero angle α to the normal axis of the surface 11 of said structure.

In other words, the step of forming passivating regions 42 in the intrinsic collector region 23 comprises implanting, in the presence of the same mask 49 as used for the implantation of the selectively implanted region 51, carbon at an oblique angle α.

Depending on the geometries of the mask 49 and of the aperture 50, and in particular on the thickness of the mask 49 and on the width of the aperture 50, the angle α may be dimensioned so that the carbon implantation forms pockets of carbon 42 that are positioned locally on either side of the selectively overdoped collector region 51.

Furthermore, a rotation β of 180° of the ion beam IB about the axis normal to the structure allows said pockets of carbon 42 to be formed on either side of the selectively overdoped collector region 51.

Advantageously, three rotations β of 90° of the ion beam IB about the axis normal to the structure allows said pockets of carbon 42 to be formed flanking the selectively overdoped collector region 51 on four sides.

For example, the carbon implantation is carried out, for an angle α larger than 10° (degrees), with a concentration per unit area comprised between $10^{15}$ at/cm$^2$ and $10^{16}$ at/cm$^2$ and with an energy comprised between 10 keV and 100 keV.

Figure 11:
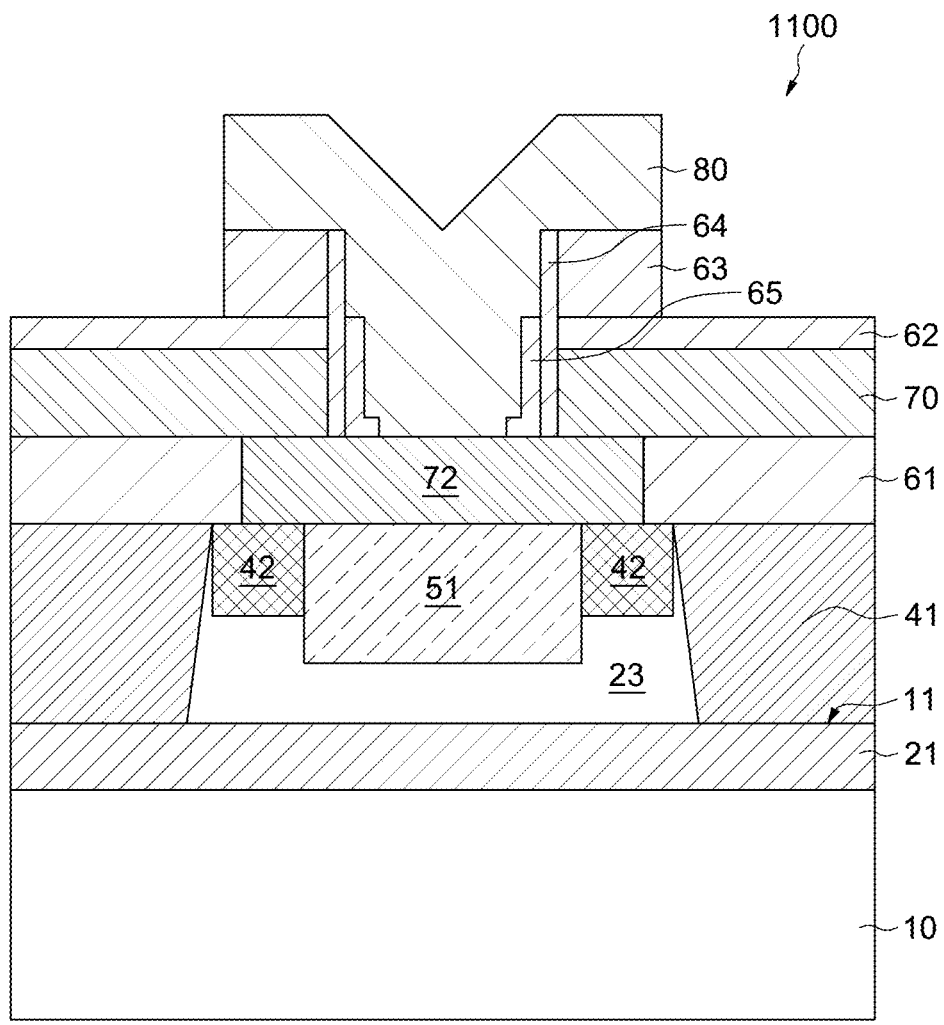

FIG. 11 shows a second embodiment of a heterojunction bipolar transistor 1100 produced via the second method of implementation of the process.

In the second method of implementation, the steps of forming the insulating region 61, the extrinsic base region 70, the second oxide layer 62 and the nitride layer 63; of forming the intrinsic base region 72; and of forming the intrinsic emitter 80; i.e. the steps such as described above with reference to FIGS. 4 to 7, are carried out in a homologous way on the structure described above with reference to FIG. 10, the mask 49 having been removed.

The heterojunction bipolar transistor 1100 thus produced includes, unlike the heterojunction bipolar transistor 700 such as described above with reference to FIG. 7, a selectively overdoped collector region 51 comprising a region containing dopants that are implanted vertically into the intrinsic collector region 23.

Said carbon-containing passivating regions 42 in the intrinsic collector region 23 are such that they face the extrinsic base region 70 only in the position of said pockets 42 located on either side of said selectively overdoped collector region 51.

Moreover, the passivating regions 40 formed in the intrinsic collector region, as described above with reference to FIG. 2, are not present in the structure of the second embodiment of the heterojunction bipolar transistor, and are replaced by lateral isolating regions 41, which are shallow trench isolations.

Figure 12:
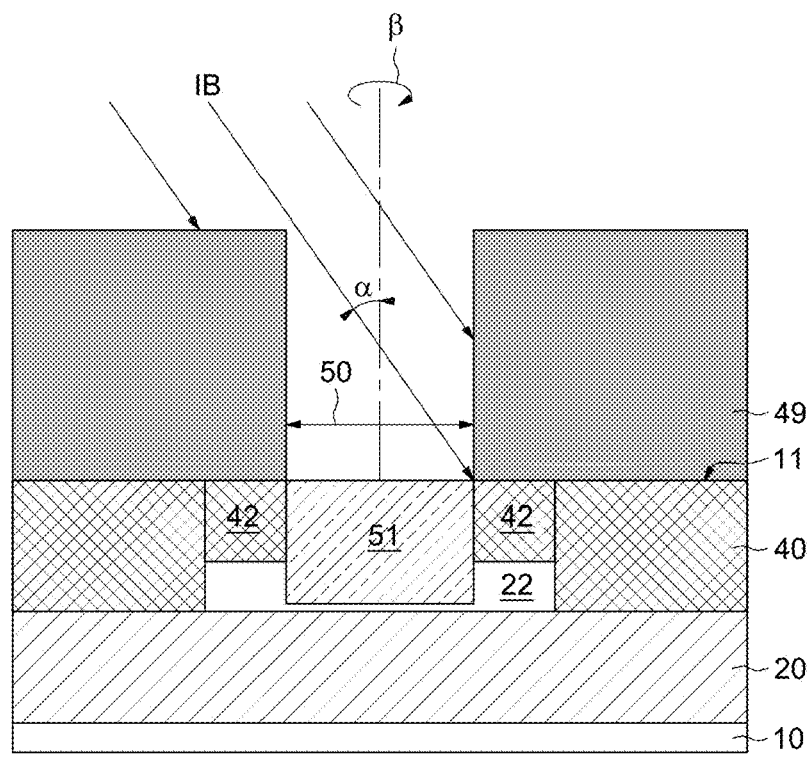
FIGS. 12 and 13 schematically illustrate another method of implementation of a process to form a transistor.
Figure 13:
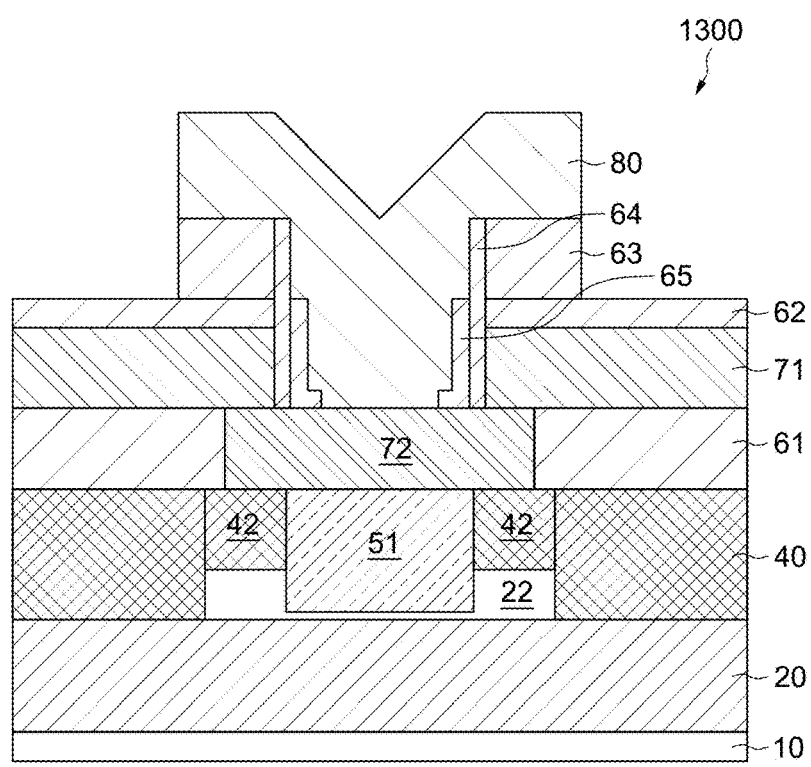

FIGS. 12 and 13 show the results of steps of a third method of implementation of the process for fabricating a heterojunction bipolar transistor.

The third method of implementation of the process is identical to the first method of implementation described above with reference to FIGS. 1 to 7.

However, the third method of implementation furthermore includes a step of forming a selectively implanted collector region 51, and a step of forming pockets of carbon 42 in the intrinsic collector region 23, these steps being similar to the corresponding steps of the second method of implementation of the process, which steps were described above with reference to FIG. 10, but being carried out on the structure described above with reference to FIG. 2, the mask 39 having been removed.

FIG. 12 shows an irradiation of the structure described above with reference to FIG. 2, with an ion beam IB that is inclined by an angle α to the normal axis of the surface 11a of the subjacent structure, homologously to the radiation described above with reference to FIG. 10.

FIG. 13 shows a third embodiment of a heterojunction bipolar transistor 1300 produced via the third method of implementation of the process.

In the third method of implementation, the steps of forming the insulating region 61, the extrinsic base region 70, the second oxide layer 62 and the nitride layer 63; of forming the intrinsic base region 72; and of forming the intrinsic emitter 80; i.e. the steps such as described above with reference to FIGS. 4 to 7, are carried out in a homologous way on the structure described above with reference to FIG. 12, the mask 49 having been removed.

The heterojunction bipolar transistor 1300 thus produced includes, unlike the heterojunction-bipolar-transistor structure 700 described above with reference to FIG. 7, a selectively implanted collector region 51 comprising a region containing dopants that are implanted vertically into the intrinsic collector layer 22.

Said carbon-containing passivating regions include, in this example embodiment, said pockets of carbon 42 that are positioned locally on either side of the selectively overdoped collector region 51.

It will be recalled that, in the first and third methods of implementation, the carbon-containing passivating regions 40 face the extrinsic base region 70 in the entirety of the zone called the bipolar zone, i.e. that zone of the substrate 10 in which heterojunction bipolar transistors 700, 1300 according to these methods of implementation are fabricated.

Such a mutualization of the formation of the passivating regions 40 for a plurality of examples of heterojunction bipolar transistors, allows the migration of dopants to be neutralized over the entire extent of the portion of the structure that creates the extrinsic base-collector capacitor, i.e. the portion comprising a superposition of the intrinsic collector regions 22, insulating region 61 and extrinsic base region 70.

Advanced electronic devices, such as high-frequency telecommunication devices, satellite antennae, radar systems, or even what are called time-of-flight video cameras, may advantageously be equipped with such integrated circuits including bipolar transistors according to embodiments of the invention.

Moreover, the invention is not limited to these embodiments and methods of implementation, but encompasses any variant thereof; for example, numerical values have been given for fabrication parameters by way of example, and these values may of course be adapted to different technologies; furthermore, as was mentioned above, although described with reference to the fabrication of a heterojunction bipolar transistor, the invention is perfectly applicable to any type of bipolar junction transistor.

The invention claimed is:

1. A process for fabricating a bipolar junction transistor, comprising steps of:
    forming a buried extrinsic collector region in a semiconductor substrate underneath an intrinsic collector region;
    forming an insulating region in contact with an upper surface of the intrinsic collector region;
    forming an extrinsic base region on the insulating region; and
    forming, between the formation of the buried extrinsic collector region and the formation of the insulating region, carbon-containing passivating regions in the intrinsic collector region and facing the extrinsic base region.

2. The process according to claim 1, wherein said step of forming carbon-containing passivating regions comprises forming a carbon implant that is configured to form agglomerates with auto-interstitial crystal defects in the intrinsic collector layer.

3. The process according to claim 1, wherein said step of forming the buried extrinsic collector region in the semiconductor substrate comprises implanting dopants in a region that is localized depthwise in the semiconductor substrate, the intrinsic collector layer comprising a portion of the semiconductor substrate, wherein said portion is located above said region that is localized depthwise in the semiconductor substrate.

4. The process according to claim 1, further comprising a step of forming, in the intrinsic collector region, a selectively overdoped collector region by implanting dopants through an aperture in a mask formed on the intrinsic collector region, wherein said step of forming carbon-containing passivating regions in the intrinsic collector region further comprises implanting carbon through said aperture in said mask at an oblique angle so that said carbon-containing passivating regions include pockets of carbon that are positioned locally on either side of the selectively overdoped collector region.

5. The process according to claim 4, wherein said step of forming carbon-containing passivating regions in the intrinsic collector region is such that the carbon-containing passivating regions formed face the extrinsic base region only in said pockets located on either side of said selectively overdoped collector region, the process further comprising forming lateral isolating regions in the rest of the intrinsic collector region facing the extrinsic base region.

6. The process according to claim 1, wherein said bipolar junction transistor is a heterojunction bipolar transistor.

7. A process for fabricating a bipolar junction transistor, comprising:
    forming a buried extrinsic collector region of the bipolar junction transistor in a semiconductor substrate underneath a layer of the semiconductor substrate;
    forming carbon-containing passivating regions in the layer of the semiconductor substrate above the buried extrinsic collector region to delimit an intrinsic collector region;
    depositing a stack of layers over the carbon-containing passivating regions and the intrinsic collector region, said stack of layers including a first insulating layer, a semiconductor layer and a second insulating layer;
    forming a first opening extending through the semiconductor layer and the second insulating layer;
    lining walls of the first opening with an insulating layer;
    removing a portion of the first insulating layer to form a second opening which exposes an upper surface of the intrinsic collector region and a lower surface of the semiconductor layer;
    epitaxially growing a base region of the bipolar junction transistor in said second opening from at least said intrinsic collector region; and
    epitaxially growing a collector region of the bipolar junction transistor in said first opening from at least said base region.

8. The process according to claim 7, wherein forming carbon-containing passivating regions comprises forming a carbon implant that is configured to form agglomerates with auto-interstitial crystal defects in the intrinsic collector layer.

9. The process according to claim 7, wherein said bipolar junction transistor is a heterojunction bipolar transistor.

10. A process for fabricating a bipolar junction transistor, comprising:
    forming an extrinsic collector region of the bipolar junction transistor in a semiconductor substrate;
    forming a layer of semiconductor material on the extrinsic collector region;
    forming shallow trench isolation region in the layer of the semiconductor material above the extrinsic collector region to delimit an intrinsic collector region;
    forming carbon pockets in the intrinsic collector region which delimit an overdoped collector region in the intrinsic collector region;
    depositing a stack of layers over the shallow trench isolation region, carbon pockets and the intrinsic collector region, said stack of layers including a first insulating layer, a semiconductor layer and a second insulating layer;
    forming a first opening extending through the semiconductor layer and the second insulating layer;
    lining walls of the first opening with an insulating layer;
    removing a portion of the first insulating layer to form a second opening which exposes an upper surface of the overdoped collector region and a lower surface of the semiconductor layer;
    epitaxially growing a base region of the bipolar junction transistor in said second opening from at least said overdoped collector region; and
    epitaxially growing a collector region of the bipolar junction transistor in said first opening from at least said base region.

11. The process according to claim 10, wherein forming carbon pockets comprises:
forming a mask on the intrinsic collector region, said mask including an aperture; and
implanting carbon through said aperture in said mask at an oblique angle so that said carbon-containing passivating regions include pockets of carbon that are positioned locally on either side of the overdoped collector region.

12. The process according to claim 10, wherein forming carbon pockets comprises forming a carbon implant that is configured to form agglomerates with auto-interstitial crystal defects in the intrinsic collector layer.

13. The process according to claim 10, wherein said bipolar junction transistor is a heterojunction bipolar transistor.

14. A process for fabricating a bipolar junction transistor, comprising:
forming a buried extrinsic collector region of the bipolar junction transistor in a semiconductor substrate underneath a layer of the semiconductor substrate;
forming carbon-containing passivating regions in the layer of the semiconductor substrate above the buried extrinsic collector region to delimit an intrinsic collector region;
forming carbon pockets in the intrinsic collector region which delimit an overdoped collector region in the intrinsic collector region;
depositing a stack of layers over the shallow trench isolation region, carbon pockets and the intrinsic collector region, said stack of layers including a first insulating layer, a semiconductor layer and a second insulating layer;
forming a first opening extending through the semiconductor layer and the second insulating layer;
lining walls of the first opening with an insulating layer;
removing a portion of the first insulating layer to form a second opening which exposes an upper surface of the overdoped collector region and a lower surface of the semiconductor layer;
epitaxially growing a base region of the bipolar junction transistor in said second opening from at least said overdoped collector region; and
epitaxially growing a collector region of the bipolar junction transistor in said first opening from at least said base region.

15. The process according to claim 14, wherein forming carbon pockets comprises:
forming a mask on the intrinsic collector region, said mask including an aperture; and
implanting carbon through said aperture in said mask at an oblique angle so that said carbon-containing passivating regions include pockets of carbon that are positioned locally on either side of the overdoped collector region.

16. The process according to claim 14, wherein forming carbon pockets comprises forming a carbon implant that is configured to form agglomerates with auto-interstitial crystal defects in the intrinsic collector layer.

17. The process according to claim 14, wherein said bipolar junction transistor is a heterojunction bipolar transistor.

18. A process for fabricating a bipolar junction transistor, comprising steps of:
forming a buried extrinsic collector region in a semiconductor substrate underneath an intrinsic collector region;
forming, in the intrinsic collector region, a selectively overdoped collector region by implanting dopants through an aperture in a mask formed on the intrinsic collector region;
forming carbon-containing passivating regions in the intrinsic collector region by implanting carbon through said aperture in said mask at an oblique angle so that said carbon-containing passivating regions include pockets of carbon that are positioned locally on either side of the selectively overdoped collector region;
removing the mask and then forming an insulating region on the intrinsic collector region;
forming an extrinsic base region on the insulating region, wherein the carbon-containing passivating regions in the intrinsic collector region face the extrinsic base region.

19. The process according to claim 18, wherein forming carbon-containing passivating regions comprises forming a carbon implant that is configured to form agglomerates with auto-interstitial crystal defects in the intrinsic collector layer.

20. The process according to claim 18, wherein forming the buried extrinsic collector region in the semiconductor substrate comprises implanting dopants in a region that is localized depthwise in the semiconductor substrate, the intrinsic collector layer comprising a portion of the semiconductor substrate, wherein said portion is located above said region that is localized depthwise in the semiconductor substrate.

21. The process according to claim 18, wherein forming carbon-containing passivating regions in the intrinsic collector region is such that the carbon-containing passivating regions formed face the extrinsic base region only in said pockets located on either side of said selectively overdoped collector region.

22. The process according to claim 18, further comprising forming lateral isolating regions in the intrinsic collector region facing the extrinsic base region.

23. The process according to claim 18, wherein said bipolar junction transistor is a heterojunction bipolar transistor.

* * * * *